(12) United States Patent
Liu et al.

(10) Patent No.: US 12,302,533 B1
(45) Date of Patent: May 13, 2025

(54) MOBILE TERMINAL

(71) Applicant: OBLUE COMMUNICATION TECHNOLOGY (SHENZHEN) CO., LTD, Guangdong (CN)

(72) Inventors: Yongjiang Liu, Guangdong (CN); Tingwen Zhai, Guangdong (CN); Shaoyi Zheng, Guangdong (CN)

(73) Assignee: OBLUE COMMUNICATION TECHNOLOGY (SHENZHEN) CO., LTD, Shenzhen (CN)

( * ) Notice: Subject to any disclaimer, the term of this patent is extended or adjusted under 35 U.S.C. 154(b) by 0 days.

(21) Appl. No.: 18/920,012

(22) Filed: Oct. 18, 2024

Related U.S. Application Data

(63) Continuation of application No. PCT/CN2024/120928, filed on Sep. 25, 2024.

(30) Foreign Application Priority Data

| | | |
|---|---|---|
| Jan. 11, 2024 | (CN) | 202410046881.4 |
| Jul. 1, 2024 | (CN) | 202421531262.6 |
| Jul. 1, 2024 | (CN) | 202421542154.9 |

(51) Int. Cl.
*H05K 7/20* (2006.01)
*G06F 1/20* (2006.01)

(52) U.S. Cl.
CPC ........... *H05K 7/2039* (2013.01); *G06F 1/203* (2013.01); *H05K 7/20136* (2013.01)

(58) Field of Classification Search
CPC ......... G06F 1/203; G06F 1/20; H05K 7/2039; H05K 7/20136; H05K 7/20972; H05K 7/20145; H05K 7/20154; H05K 2201/10106; H05K 2201/10121; H05K 7/20

See application file for complete search history.

(56) References Cited

U.S. PATENT DOCUMENTS

| | | | | |
|---|---|---|---|---|
| 2008/0078733 | A1* | 4/2008 | Nearman | G09F 9/3026 211/189 |
| 2010/0118279 | A1* | 5/2010 | Itsuki | H04N 9/3144 353/54 |
| 2010/0306022 | A1* | 12/2010 | Plut | G06Q 30/0256 705/14.54 |
| 2012/0106082 | A1* | 5/2012 | Wu | G06F 1/203 361/695 |

(Continued)

*Primary Examiner* — Adam B Dravininkas
(74) *Attorney, Agent, or Firm* — Daniel M. Cohn

(57) ABSTRACT

A mobile terminal includes a terminal housing, a projector, a heat dissipate block and a blower. The terminal housing includes a frame and a heat dissipate chamber connected to an inner periphery of the frame, the heat dissipate chamber has an assembly opening, an air inlet and an outlet passages. The projector is provided in the terminal housing and outside the heat dissipate chamber. The heat dissipate block is thermally conductive and fixedly connected to the projector, and covered and fixed to the assembly opening of the heat dissipate chamber, the heat dissipate block is configured to absorb the heat generated by the projector during operation. The blower is provided in the heat dissipate chamber and covered by the heat dissipate block, and is configured to make air outside enter the heat dissipate chamber through the air inlet passage and discharged through the air outlet passage.

10 Claims, 9 Drawing Sheets

(56) References Cited

U.S. PATENT DOCUMENTS

2014/0009883 A1\* 1/2014 Fujiwara .................. G06F 1/20
                                                    361/679.48
2018/0088398 A1\* 3/2018 Lee .................... H05K 7/20145

\* cited by examiner

MOBILE TERMINAL

TECHNICAL FIELD

The present disclosure relates to the technical field of mobile terminals, and in particular, to a mobile terminal having a projector.

BACKGROUND

A projection mobile terminal is a mobile terminal with an integrated projection function. In view of the fact that micro-projection technology has been developed for several years, the technology is relatively stable and mature, and even with the addition of projection as a function, no significant change is present in the shape of the mobile terminal.

The current projection mobile terminal has either bad heat dissipation performance or bad waterproof performance. For example, the projection cell phone with optimized radiator structure disclosed in CN207010747U has an internal chamber connected to the outside as a whole through an air inlet and an air outlet, and has poor waterproof performance.

SUMMARY

The present disclosure provides a mobile terminal, intending to solve a technical problem in the prior art in which a projection mobile terminal fails to balance heat dissipation and waterproof performance.

In order to solve the above technical problem, the present disclosure provides a mobile terminal, including a terminal housing, a projector, a heat dissipate block and a blower. The terminal housing includes a frame and a heat dissipate chamber connected to an inner periphery of the frame, the heat dissipate chamber has an assembly opening, an air inlet passage, and an air outlet passage. The projector is provided in the terminal housing and provided outside the heat dissipate chamber. The heat dissipate block is thermally conductive and fixedly connected to the projector, and covered and fixed to the assembly opening of the heat dissipate chamber, the heat dissipate block is configured to absorb the heat generated by the projector during operation. The blower is provided in the heat dissipate chamber and covered by the heat dissipate block, the blower is configured to cause air outside to enter the heat dissipate chamber through the air inlet passage and to be discharged through the air outlet passage.

The mobile terminal provided by the present disclosure is further provided with a heat dissipate chamber in the frame, such that it is easy to manufacture, structurally sound, easy to assemble, and has better heat dissipation performance as well as better sealing performance. When assembled, the heat dissipate block that is thermally conductive and fixedly connected to the projector can cover and then lock the heat dissipate chamber by screws, the heat dissipate block and the heat dissipate chamber can form a heat dissipation sealing chamber after covered. Even if the liquid enters into the heat dissipate chamber via the air inlet passage or the air outlet passage, the rest electronic components inside the mobile terminal won't be affected.

DESCRIPTION OF EMBODIMENTS

Figure 1:
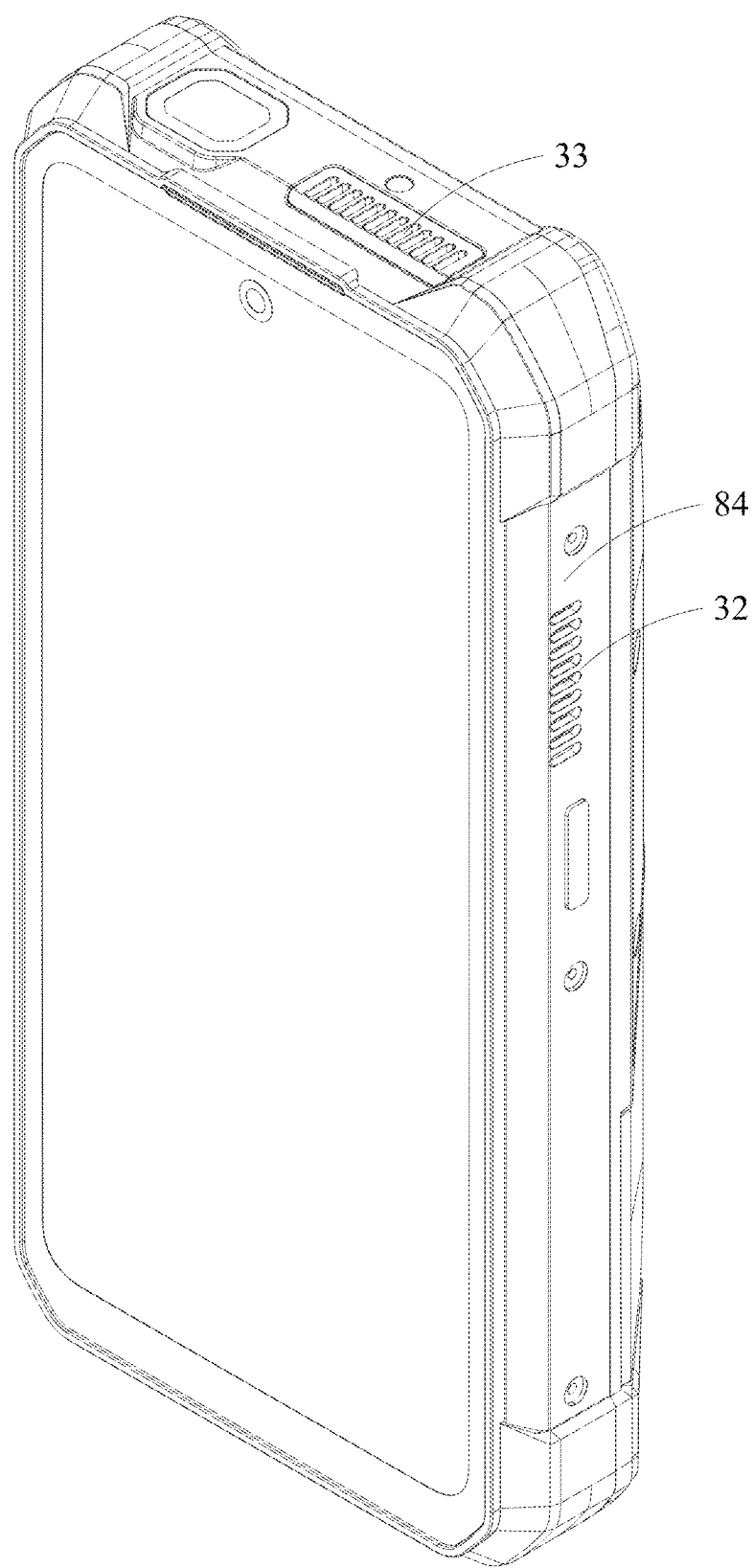
FIG. 1 is a schematic diagram illustrating a 3D structure of the mobile terminal provided in the present disclosure.

As shown in FIGS. 1 to 9, an embodiment according to the present disclosure provides a mobile terminal, which may be a device such as a cellular phone or a tablet computer. The mobile terminal includes a screen 81, a terminal housing 2, a projector 9, a heat dissipate block 7, a blower 4, a terminal rear cover 17, and other components. Of course, the mobile terminal also includes other conventional functional components such as a battery, a main control circuit board, etc., which will not be discussed herein since no inventive points are involved.

Figure 3:
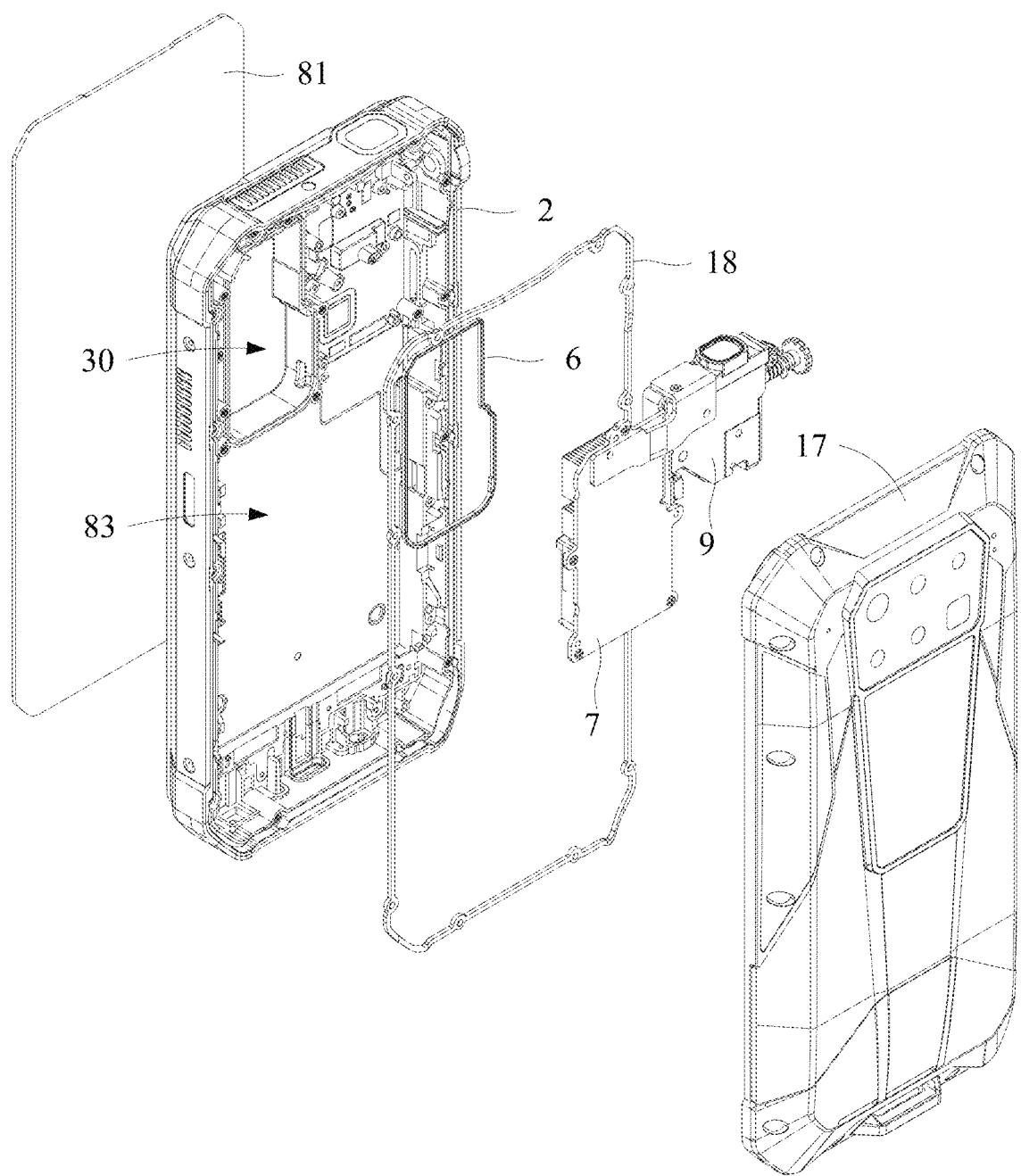
FIG. 3 is an exploded schematic diagram illustrating another view of the mobile terminal shown in FIG. 1.
Figure 4:
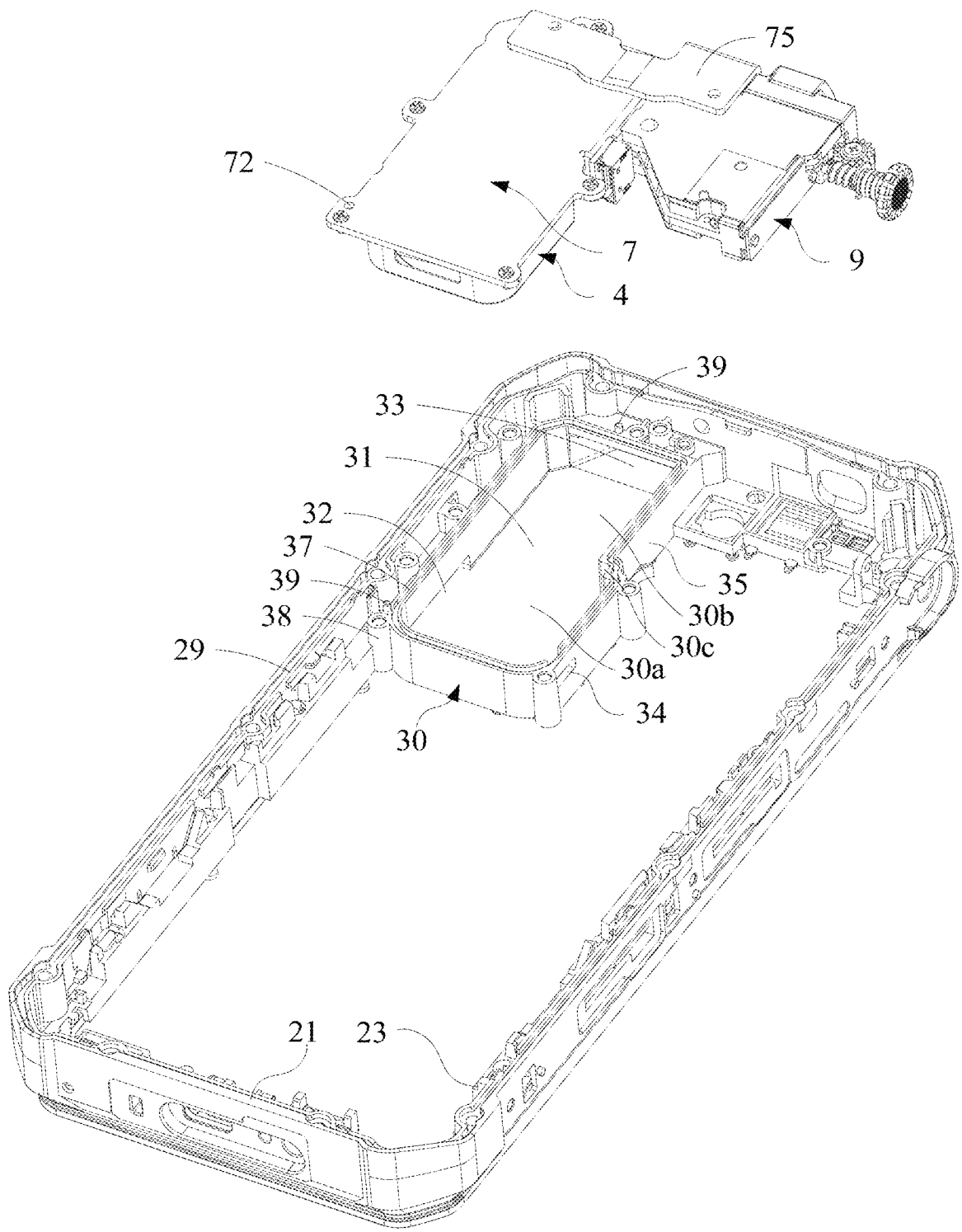
FIG. 4 is a schematic diagram illustrating structures of some of the assembly in FIG. 3.
Figure 5:
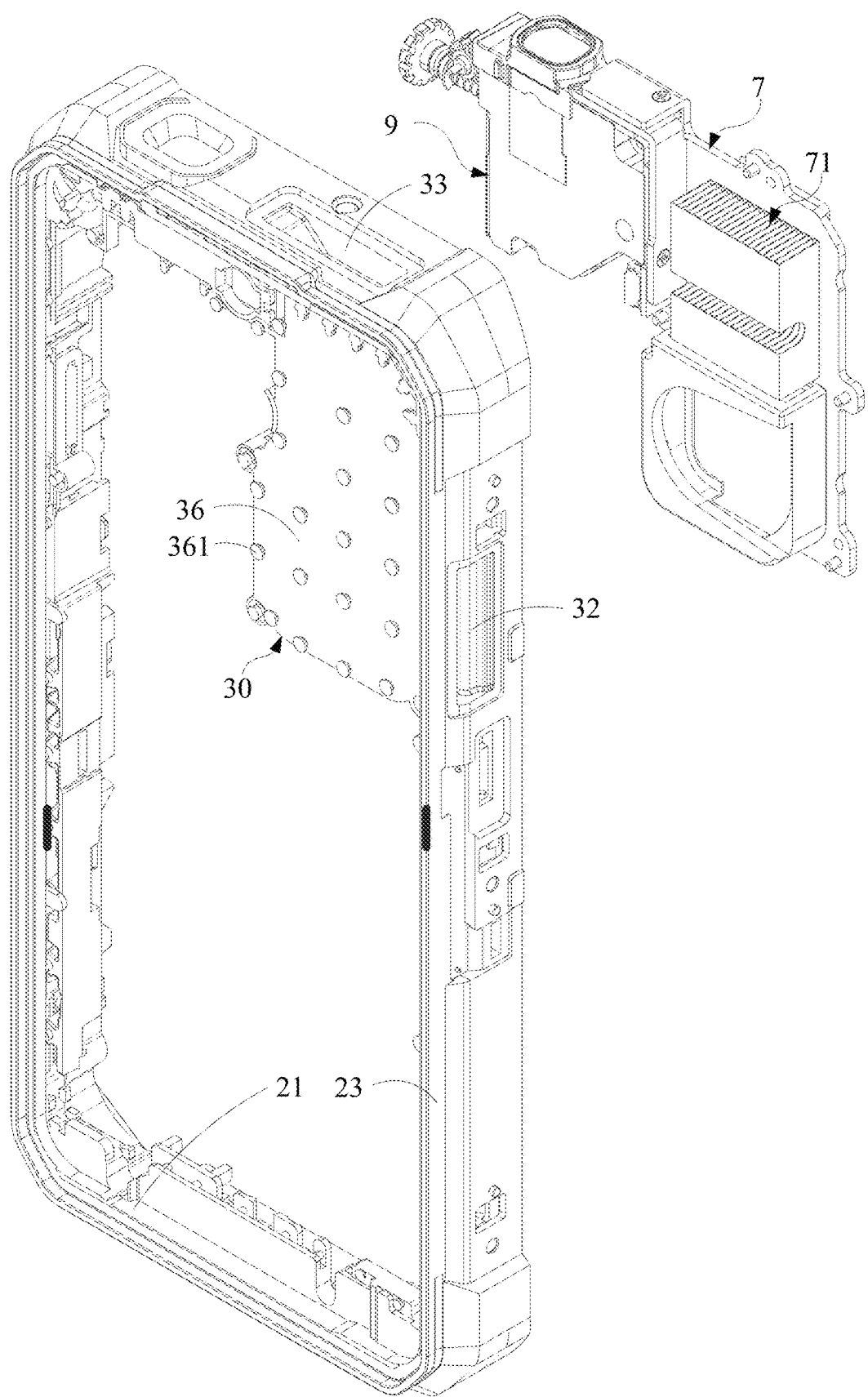
FIG. 5 is a schematic diagram illustrating structures of some of the assembly in FIG. 2.

As shown in FIGS. 3 to 5, the terminal housing 2 includes a frame and a heat dissipate chamber 30 connected to the inner periphery of the frame, and the heat dissipate chamber 30 has a connected assembly opening 31, an air inlet passage 32, and an air outlet passage 33. A projector 9 is provided in the terminal housing 2 and is located outside the heat dissipate chamber 30. The heat dissipate block 7 is thermally conductive and fixedly connected to the projector 9, and is covered and then fixed to the assembly opening 31 of the heat dissipate block 30, and the heat dissipate block 7 is configured to absorb the heat generated by the projector 9 during operation. The blower 4 is provided in the heat dissipate chamber 30 and is covered by the heat dissipate block 7, and the blower 4 is configured to make the external air enter the heat dissipate chamber 30 through the air inlet passage 32 and be discharged through the air outlet passage 33, and thus the heat of the projector 9 can be taken away.

Figure 2:
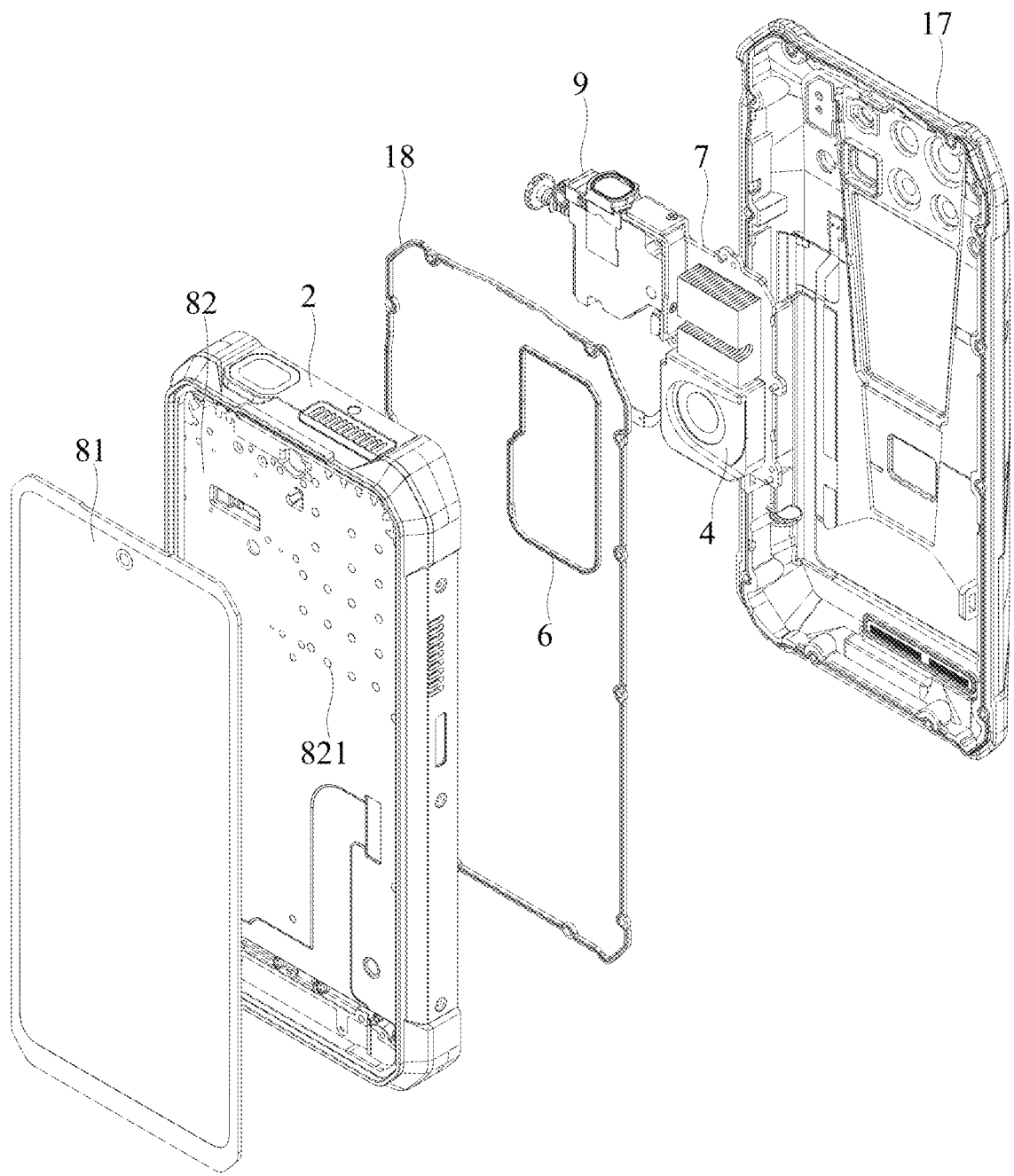
FIG. 2 is an exploded schematic diagram illustrating one view of the mobile terminal shown in FIG. 1.

As shown in FIGS. 2 and 3, the terminal housing 2 further includes a rib plate 82 embedded in the frame and dividing the frame into a front chamber and a rear chamber, the rear chamber includes the heat dissipate chamber 30 and a main chamber 83.

The volume of the heat dissipate chamber 30 is smaller than the volume of the main chamber 83, and the heat dissipate chamber 30 is provided at an end corner or side of the main chamber 83. The heat dissipate chamber 30 includes a first width part 30a proximate to the air inlet passage 32 and a second width part 30b proximate to the air outlet passage 33, and the width of the first width part 30a is greater than the width of the second width part 30b, in order to form a step assembly structure 30c for positioning and mounting the blower 4, such that the assembly is extremely easy.

The main chamber 83 may be configured for assembling functional components such as a battery, a main control circuit board, and the like.

The mobile terminal also includes a screen 81, a terminal rear cover 17, and a first seal ring 18. The screen 81 is assembled based on the front chamber, the frame or the terminal rear cover 17 is provided with a first seal groove 29, the first seal ring 18 is provided within the first seal groove 29 in a match manner. The terminal rear cover 17 and the frame clamp the first seal ring 18 and secure it by a plurality of screws to form a sealing fit.

As shown in FIGS. 4 and 5, the frame may include a pair of short-side frame bodies 21 and a pair of long-side frame bodies 23 that are connected.

In one embodiment of the present disclosure, the short-side frame bodies 21 expose the air outlet passage 33 and the long-side frame bodies 23 expose the air inlet passage 32.

In other embodiment, the short-side frame bodies 21 expose the air inlet passage 32 and the long-side frame bodies 23 expose the air outlet passage 33.

As shown in FIG. 4, the frame and the heat dissipate chamber 30 are integrally formed by injection molding. The heat dissipate chamber 30 includes an enclosing wall 35 and a base plate 36 that are connected. The air inlet passage 32 may be provided on the enclosing wall 35, and the air outlet passage 33 may be provided either on the enclosing wall 35 or on the base plate 36.

As shown in FIGS. 2 to 4, the mobile terminal further comprises a second seal ring 6. The top of the enclosing wall 35 is provided with a seal groove 37 for assembling the second seal ring 6, and the heat dissipate block 7 is pressed over the second seal ring 6 and sealing fit with the top of the enclosing wall 35.

The first seal ring 18 and the second seal ring 6 form a double seal inside the mobile terminal, such that the main chamber 83 can be better sealingly protected, and whether or not the liquid enters the heat dissipate chamber 30 does not have an effect on the main control circuit board inside the mobile terminal. That is to say, the heat dissipate chamber 30 is a zone where liquid can be entered, while the main chamber 83 is able to isolate the liquid from entering through the double seal of the first seal ring 18 and the second seal ring 6. The heat dissipation performance and the waterproof performance can be better balanced according to such arrangement.

As shown in FIG. 4, a plurality of lock posts 38 are provided around the perimeter of the heat dissipate chamber 30, and the heat dissipate block 7 is provided with a plurality of lock holes corresponding to the plurality of lock posts 38. The enclosing wall 35 is provided with a wire lead groove 34 configured to lead out of the blower 4's own wires. The blower 4's own wires can be electrically connected to the main control circuit board in order to dissipate the heat when desired. The wire lead groove 34 and the blower 4's own wires can be further sealed by means of gluing or the like.

The periphery of the heat dissipate chamber 30 is provided with a position post 39, and the heat dissipate block 7 is provided with a position hole 72 corresponding to the position post 39, for quick and dud-proof assembly.

The side of the heat dissipate block 7 adjacent to the projector 9 is integrally extended with a first fold edge 73 and a second fold edge 74, the first fold edge 73 and the second fold edge 74 are thermally conductive and connected to the projector 9. An auxiliary heat conductor 75 is selectively provided on the outer surface of the heat dissipate block 7, the auxiliary heat conductor 75 can increase the heat conductive path to enhance the efficiency of the heat conductivity. The auxiliary heat conductor 75 can be fixed to the outer surface of the heat dissipate block 7 at one end, and fixed to the second fold edge 74 at the other end.

As shown in FIG. 2, the rib plate 82 may be provided with an array of imbed holes 821. As shown in FIG. 5, the base plate 36 has an array of imbed bumps 361 corresponding to the imbed holes 821.

The inner surface of the heat dissipate block 7 is also provided with a heat dissipate fin 71. The heat dissipate fin 71 may be connected to the heat dissipate block 7 by laser welding. The heat dissipate fin 71 is provided adjacent to the air outlet passage 33, and the blower 4 is provided adjacent to the air inlet passage 32.

As shown in FIGS. 4 to 7, the projector 9 is provided in the terminal housing 2, and the side of the projector 9 has its own focusing gear 91. The mobile terminal also includes a worm gear 50 and a worm shaft 40 for focusing. The worm gear 50 is rotatably provided with respect to the terminal housing 2 and engaged with the focusing gear 91. A first end of the worm shaft 40 is engaged with the worm gear 50, and a second end of the worm shaft 40 extends out of the terminal housing 2. By rotating the worm shaft 40 outside the mobile terminal to drive the worm gear 50 and the focusing gear 91 in turn, a focal length of the projector 9 can be fine-tuned. Since the worm shaft 40 rotates one circle, the worm gear 50 only rotates one tooth, such that a large reduction ratio can be achieved, so as to realize the precise fine-tuning of the focal length.

One short-side frame body 21 is provided with a first insert hole 22 for inserting the projector 9's own lens 92, and one long-side frame body 23 is provided with a second insert hole 24 for inserting the worm gear 40. Alternatively, one short-side frame body 21 is provided with a first insert hole 22 for inserting the worm gear 40, and one long-side frame body 23 is provided with a second insert hole 24 for inserting the projector 9's own lens 92.

Figure 6:
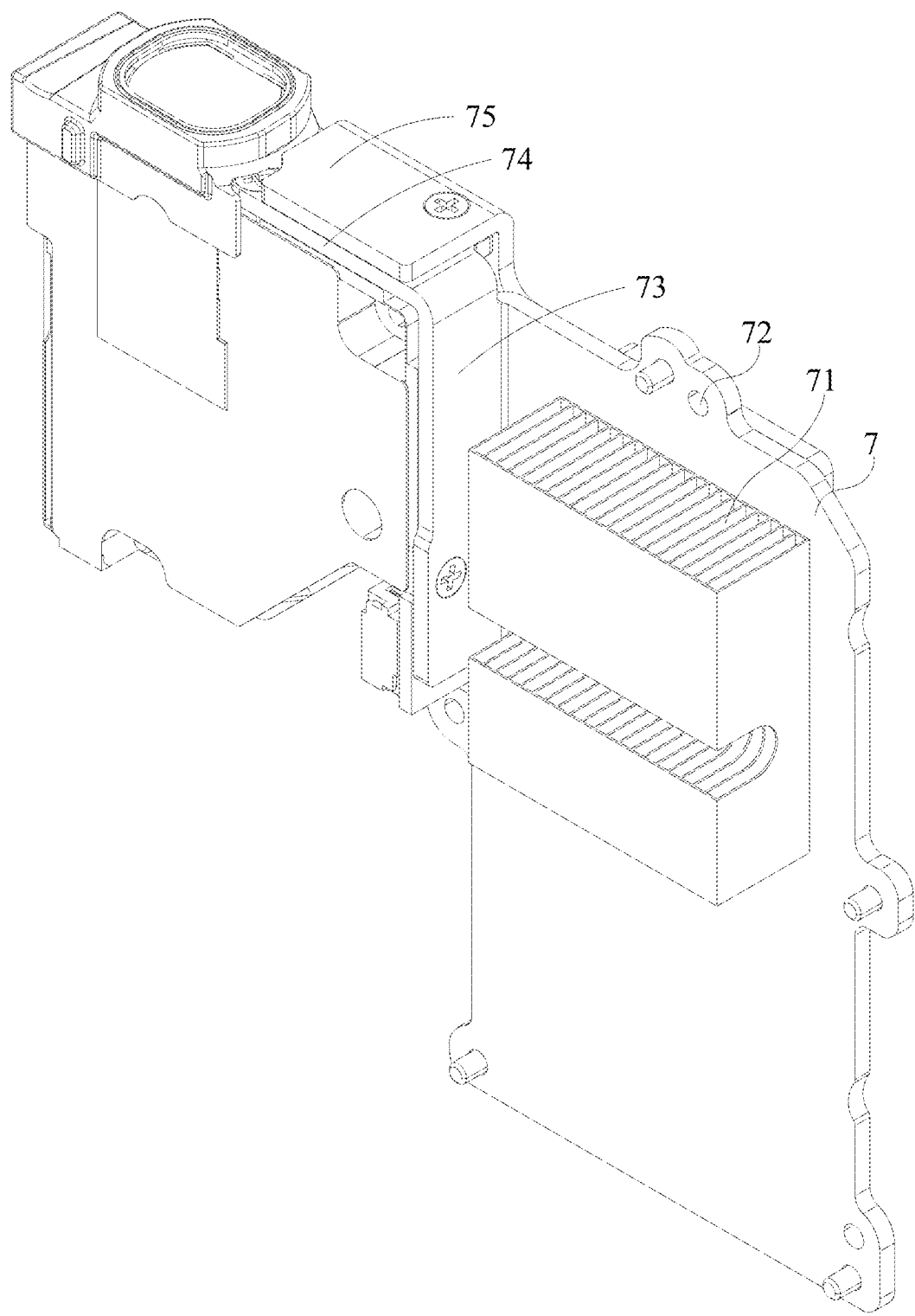
FIG. 6 is an enlarged schematic diagram illustrating some of the assembly in FIG. 5.
Figure 7:
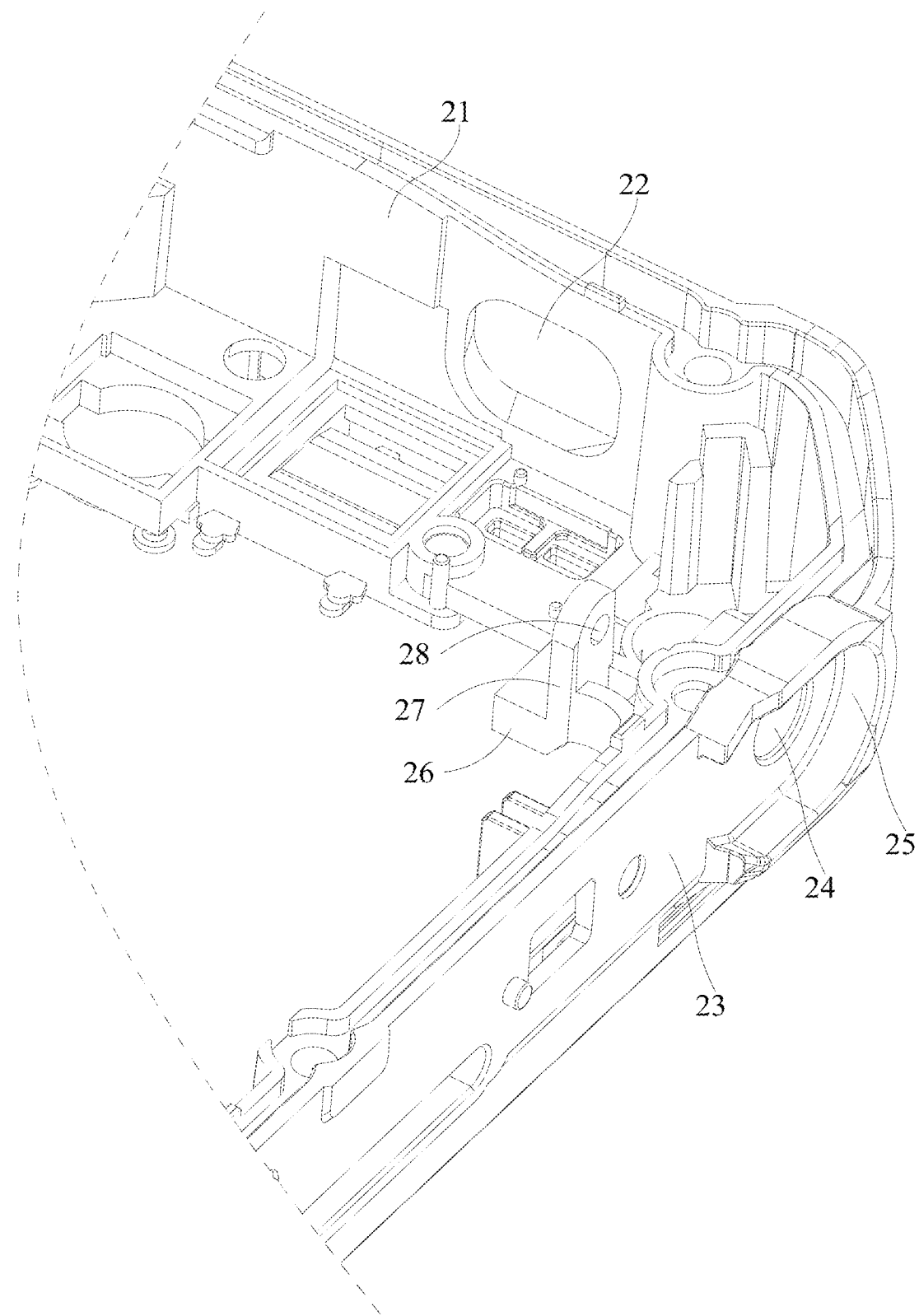
FIG. 7 is an enlarged schematic diagram illustrating some of the assembly in FIG. 4.
Figure 8:
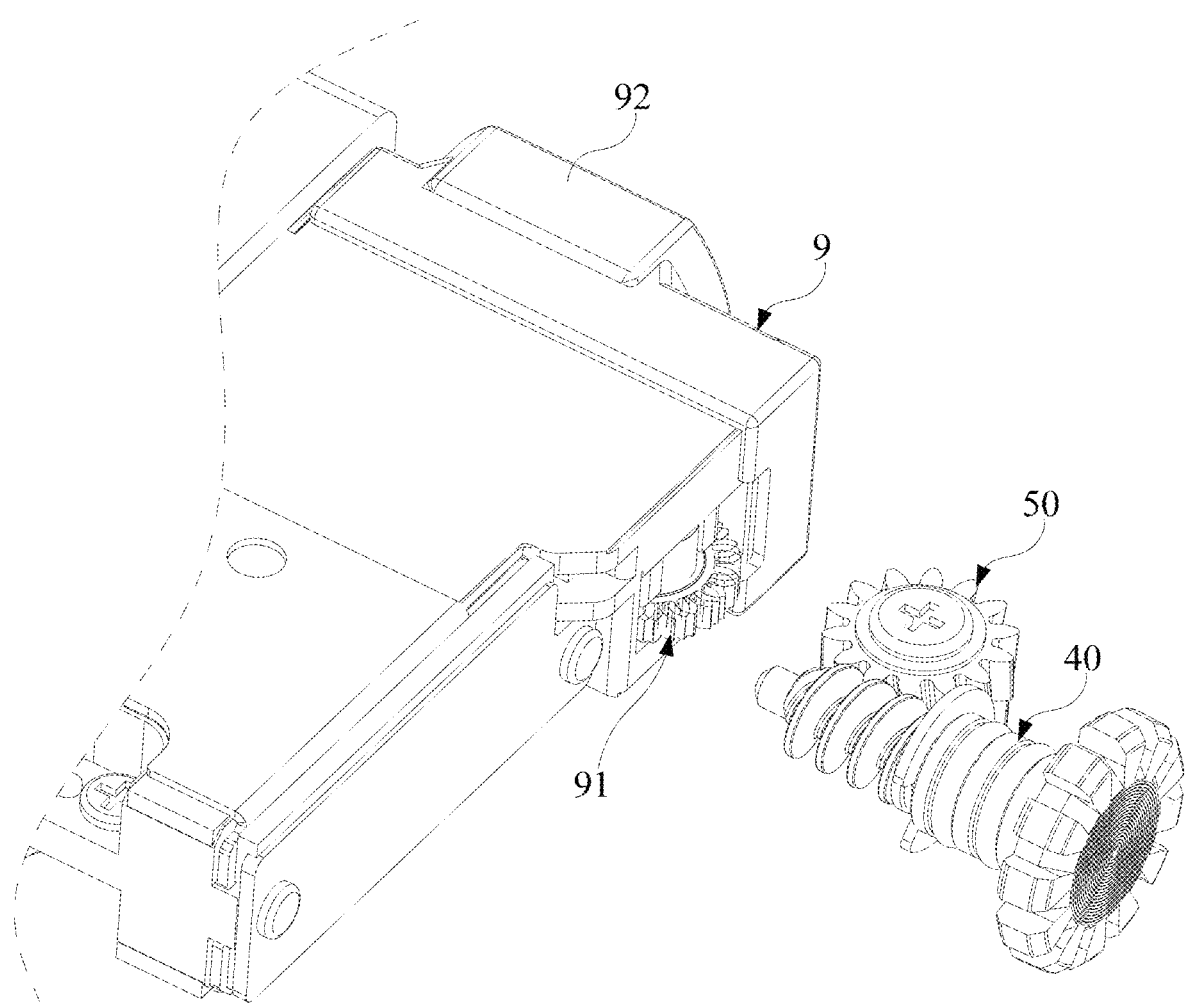
FIG. 8 is an enlarged schematic diagram illustrating some of the assembly in FIG. 4.
Figure 9:
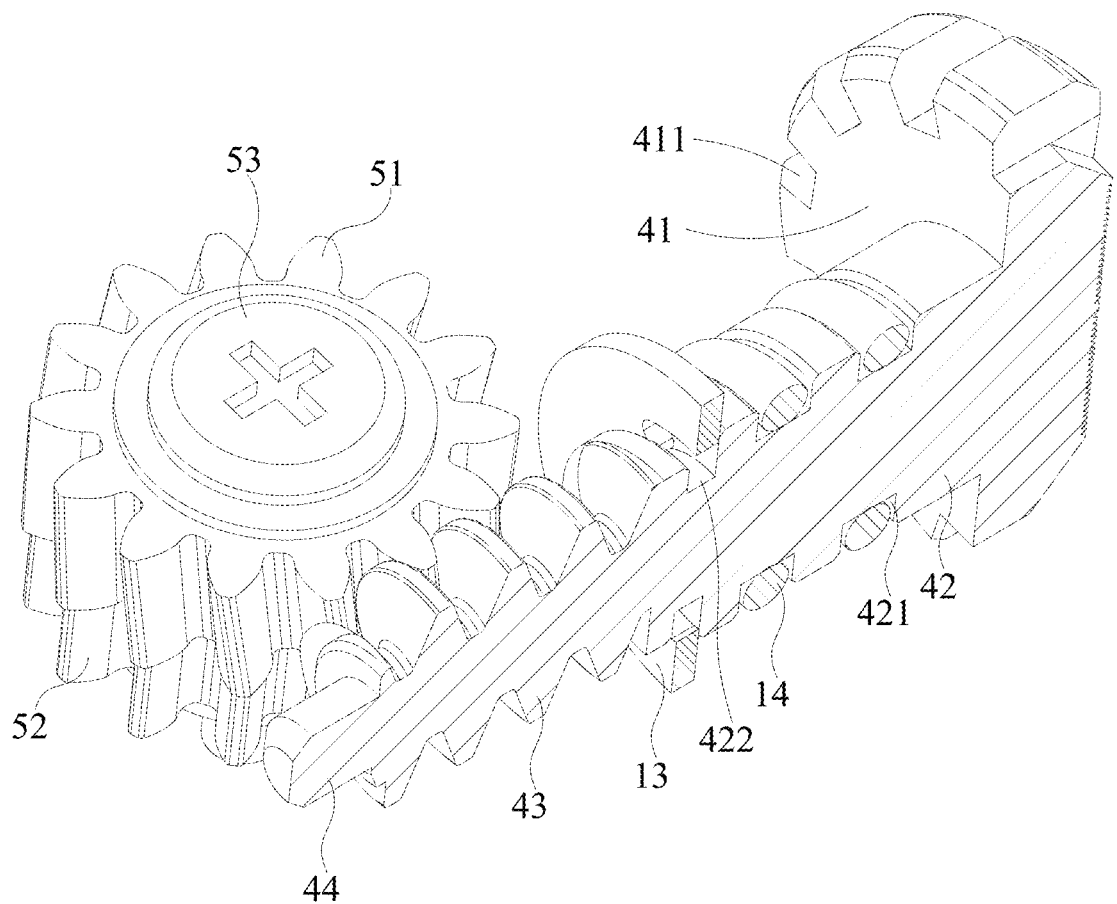
FIG. 9 is a schematic diagram illustrating a cross-sectional structure of the partial assembly in FIG. 8.

Combining with FIG. 6, the terminal housing 2 further comprises an extend plate 26 integrally connected to the short-side frame bodies 21 and/or the long-side frame bodies 23. The extend plate 26 is further provided with a support plate 27 provided with a support hole 28, the support hole 28 is aligned with the second insert hole 24, and the support hole 28 and the second insert hole 24 support both ends of the worm gear 40, respectively. The extend plate 26 or the rib plate 82 is provided with an axle, and the worm gear 50 is rotatably provided on the axle and limited by a limit member 53. The limit member 53 may be a screw.

In the embodiment of the present disclosure, the worm gear 50 comprises a helical tooth part 51 and a straight tooth part 52 that are axially connected. The helical tooth part 51 is engaged with the worm shaft 40, and the straight tooth part 52 is engaged with the focusing gear 91.

A toggle focusing handle 41 is provided at the second end of the worm shaft 40, and the toggle focusing handle 41 is disk-shaped and provided with a plurality of tooth grooves 411 on an outer peripheral side thereof.

The worm gear 40 includes the toggle focusing handle 41, a seal assembly section 42, a threaded section 43 and a rotating section 44 that are connected sequentially from outside to inside. The diameters of the toggle focusing handle 41, the seal assembly section 42, the threaded section 43 and the rotating section 44 are sequentially reduced. The toggle focusing handle 41 is limitably assembled outside the second insert hole 24, the seal assembly section 42 is socketed with the second insert hole 24. The seal assembly section 42 is provided with a seal groove 421 for assembling the toggle focusing seal 14, the threaded section 43 is engaged with the worm gear 50, and the rotating section 44 rotates with the support hole 28.

Between the seal assembly section 42 and the threaded section 43, a snap groove 422 is also provided, for assembling a snap ring 13, which can be snapped on an inner side of the long-side frame body 23. Alternatively, the rotating section 44 is provided with a snap ring groove for assembling the snap ring 13, which may be snapped on a side of the support plate 27 away from the second insert hole 24.

Preferably, the long-side frame body 23 is provided with a semi-enclosed retaining wall 25 at the periphery of the second insert hole 24, the semi-enclosed retaining wall 25 can prevent the toggle focusing handle 41 from being easily touched. The user can carry out the rotational operation of the toggle focusing handle 41 through the opening port of the semi-enclosed retaining wall 25, and the opening port can be oriented towards the tail end of the mobile terminal, i.e., opposite to an end for inserting the projector 9's own lens 92.

In addition, the side of the long-side frame body 23 is further fixed with a metal strip 84 to enhance the structural strength of the mobile terminal.

The mobile terminal provided by the present disclosure includes the terminal housing 2 provided with a heat dissipate chamber 30 integrally formed with the frame, such that the manufacturing is convenient, the structure is solid and easily assembled. The better heat dissipation performance can be balanced with the better sealing performance. When assembled, the heat dissipate block 7 thermally conductive and fixedly connected to the projector 9 covers and locks the heat dissipate chamber 30 by screws. The air inlet passage 32 can be provided with a dust-proof mesh, and the air outlet passage 33 can be provided with a grille. The heat dissipate block 7 and the heat dissipate chamber 30 can form a heat dissipation sealing chamber after covered, such that even if the liquid enters the chamber through the air inlet passage 32 or the air outlet passage 33, the rest electronic components inside the mobile terminal won't be affected, which is safe and reliable. The present disclosure adopts the worm gear 50 and the worm shaft 40 for precision focusing, the structure is compact and easy to operate.

The description above is only a preferred embodiment of the present disclosure, not a limitation on the present disclosure. All equivalent modification made based on the principle of the present disclosure shall fall into the scope of the present disclosure.

What is claimed is:

1. A mobile terminal comprising:
a terminal housing comprising a frame and a heat dissipate chamber connected to an inner periphery of the frame, the heat dissipate chamber having an assembly opening, an air inlet passage and an air outlet passage;
a projector provided in the terminal housing and provided outside the heat dissipate chamber;
a heat dissipate block, thermally conductive and fixed to the projector, and covered and fixed to the assembly opening of the heat dissipate chamber, the heat dissipate block being configured to absorb a heat generated by the projector during operation; and
a blower provided in the heat dissipate chamber and covered by the heat dissipate block, the blower being configured to cause air outside to enter the heat dissipate chamber through the air inlet passage and to be discharged through the air outlet passage;
wherein the frame and the heat dissipate chamber are integrally formed by injection molding; the heat dissipate chamber comprises an enclosing wall and a base plate that are connected, the air inlet passage is provided on the enclosing wall, and the air outlet passage is provided on the enclosing wall or on the base plate;
wherein the mobile terminal further comprises a second seal ring; wherein a top of the enclosing wall is provided with a second seal groove for assembling the second seal ring, the heat dissipate block is pressed over the second seal ring and sealing fit with the top of the enclosing wall.

2. The mobile terminal according to claim 1, wherein:
the terminal housing further comprises a rib plate embedded in the frame and dividing the frame into a front chamber and a rear chamber; the rear chamber comprises the heat dissipate chamber and a main chamber, a volume of the heat dissipate chamber is smaller than a volume of the main chamber, the heat dissipate chamber is provided at an end corner or a side of the main chamber; the heat dissipate chamber comprises a first width part proximate to the air inlet passage and a second width part proximate to the air outlet passage, the first width part is wider than the second width part, such that a step assembly structure is formed for positioning and mounting the blower;
the mobile terminal further comprises a screen, a terminal rear cover and a first seal ring; the screen is assembled based on the front chamber, the frame or the terminal rear cover is provided with a first seal groove, the first seal ring is provided in the first seal groove, the terminal rear cover and the frame clamp the first seal ring to form a sealing fit;
the frame comprises a pair of short-side frame bodies and a pair of long-side frame bodies that are connected together;
the short-side frame bodies expose the air outlet passage and the long-side frame bodies expose the air inlet passage; or
the short-side frame bodies expose the air inlet passage and the long-side frame bodies expose the air outlet passage.

3. The mobile terminal according to claim 1, wherein a periphery of the heat dissipate chamber is provided with a plurality of lock posts, and the enclosing wall is provided with a wire lead groove.

4. The mobile terminal according to claim 1, wherein a periphery of the heat dissipate chamber is provided with a position post, and the heat dissipate block is provided with a position hole corresponding to the position post.

5. The mobile terminal according to claim 1, wherein the heat dissipate block is integrally extended with a first fold edge and a second fold edge proximate to a side of the projector; the first fold edge and the second fold edge are thermally conductive and connected to the projector, and an outer surface of the heat dissipate block is provided with an auxiliary heat conductor selectively.

6. The mobile terminal according to claim 1, wherein the mobile terminal is a cell phone or a tablet computer; an inner surface of the heat dissipate block is further provided with a heat dissipate fin, the heat dissipate fin is provided proximate to the air outlet passage, and the blower is provided proximate to the air inlet passage.

7. The mobile terminal according to claim 2, wherein a side of the projector has its own focusing gear, the mobile terminal further comprises:
a worm gear, rotatably provided relative to the terminal housing and engaged with the focusing gear;
a worm shaft, a first end thereof is engaged with the worm gear and a second end thereof extends out of the terminal housing.

8. The mobile terminal according to claim 7, wherein:

one of the short-side frame bodies is provided with a first insert hole for inserting the projector's own lens, and one of the long-side frame bodies is provided with a second insert hole for inserting the worm shaft; or one of the short-side frame bodies is provided with the first insert hole for inserting the worm shaft, and one of the long-side frame bodies is provided with the second insert hole for inserting the projector's lens.

9. A mobile terminal comprising:

a terminal housing comprising a frame and a heat dissipate chamber connected to an inner periphery of the frame, the heat dissipate chamber having an assembly opening, an air inlet passage and an air outlet passage;

a projector provided in the terminal housing and provided outside the heat dissipate chamber;

a heat dissipate block, thermally conductive and fixed to the projector, and covered and fixed to the assembly opening of the heat dissipate chamber, the heat dissipate block being configured to absorb a heat generated by the projector during operation; and a blower provided in the heat dissipate chamber and covered by the heat dissipate block, the blower being configured to cause air outside to enter the heat dissipate chamber through the air inlet passage and to be discharged through the air outlet passage;

wherein a periphery of the heat dissipate chamber is provided with a position post, and the heat dissipate block is provided with a position hole corresponding to the position post.

10. A mobile terminal comprising:

a terminal housing comprising a frame and a heat dissipate chamber connected to an inner periphery of the frame, the heat dissipate chamber having an assembly opening, an air inlet passage and an air outlet passage;

a projector provided in the terminal housing and provided outside the heat dissipate chamber;

a heat dissipate block, thermally conductive and fixed to the projector, and covered and fixed to the assembly opening of the heat dissipate chamber, the heat dissipate block being configured to absorb a heat generated by the projector during operation; and a blower provided in the heat dissipate chamber and covered by the heat dissipate block, the blower being configured to cause air outside to enter the heat dissipate chamber through the air inlet passage and to be discharged through the air outlet passage;

wherein the heat dissipate block is integrally extended with a first fold edge and a second fold edge proximate to a side of the projector; the first fold edge and the second fold edge are thermally conductive and connected to the projector, and an outer surface of the heat dissipate block is provided with an auxiliary heat conductor selectively.

* * * * *